US007662698B2

(12) United States Patent
Tabatabaie

(10) Patent No.: US 7,662,698 B2
(45) Date of Patent: Feb. 16, 2010

(54) TRANSISTOR HAVING FIELD PLATE

(75) Inventor: Kamal Tabatabaie, Sharon, MA (US)

(73) Assignee: Raytheon Company, Waltham, MA (US)

( * ) Notice: Subject to any disclaimer, the term of this patent is extended or adjusted under 35 U.S.C. 154(b) by 455 days.

(21) Appl. No.: 11/557,348

(22) Filed: Nov. 7, 2006

(65) Prior Publication Data
US 2008/0108189 A1    May 8, 2008

(51) Int. Cl.
H01L 21/76    (2006.01)
(52) U.S. Cl. .............. 438/454; 438/579; 257/E21.407
(58) Field of Classification Search .......... 438/182, 438/454, 574–579; 257/E21.407
See application file for complete search history.

(56) References Cited

U.S. PATENT DOCUMENTS

| 4,062,747 A | 12/1977 | Chang et al. |
| 4,068,134 A | 1/1978 | Tobey, Jr. et al. |
| 4,127,932 A | 12/1978 | Hartman et al. |
| 4,170,818 A | 10/1979 | Tobey, Jr. et al. |
| 4,172,260 A | 10/1979 | Okabe et al. |
| 4,498,225 A | 2/1985 | Gutierrez et al. |
| 4,575,924 A | 3/1986 | Reed et al. |
| 4,581,621 A | 4/1986 | Reed |
| 4,600,853 A | 7/1986 | Whitlock et al. |
| 4,611,140 A | 9/1986 | Whitlock et al. |
| 4,635,083 A | 1/1987 | Cooper, Jr. |
| 4,641,161 A | 2/1987 | Kim et al. |
| 4,644,221 A | 2/1987 | Gutierrez et al. |
| 4,783,427 A | 11/1988 | Reed et al. |
| 4,799,091 A | 1/1989 | Reed |
| 4,821,093 A | 4/1989 | Iafrate et al. |
| 4,884,001 A | 11/1989 | Sacks et al. |
| 4,912,531 A | 3/1990 | Reed et al. |
| 4,926,083 A | 5/1990 | Merritt et al. |

(Continued)

FOREIGN PATENT DOCUMENTS

EP    1 326 283 A2    7/2003

(Continued)

OTHER PUBLICATIONS

Notification of transmittal of the International Search Report dated Jul. 31, 2007, PCT/US2007/022217.

(Continued)

Primary Examiner—Chandra Chaudhari
(74) Attorney, Agent, or Firm—Daly, Crowley, Mofford & Durkee, LLP

(57) ABSTRACT

A method for forming a transistor device having a field plate. The method includes forming a structure having a source, a drain, and a Tee gate. A photo-resist layer is formed on the structure with an opening therein only the one of two distal ends of the Tee gate. A metal is deposited over the photo-resist layer with portions of the metal being disposed on the photo-resist layer and with other portions of the metal passing through the opening onto the exposed portions of the dielectric layer and with distal end of the top of the Tee gate preventing such metal from being deposited onto portions of the dielectric layer disposed under it. The photo-resist layer is removed along with the portions of the metal deposited thereon while leaving portions of the metal from regions of the dielectric layer exposed by the opening to form the field gate.

6 Claims, 3 Drawing Sheets

U.S. PATENT DOCUMENTS

| | | | |
|---|---|---|---|
| 4,969,018 A | 11/1990 | Reed | |
| 4,980,596 A | 12/1990 | Sacks et al. | |
| 4,980,749 A | 12/1990 | Ohtsuka et al. | |
| 4,990,814 A | 2/1991 | Tanski et al. | |
| 4,990,977 A | 2/1991 | Hack et al. | |
| 4,996,573 A | 2/1991 | Hack et al. | |
| 5,006,483 A | 4/1991 | Ohtsuka et al. | |
| 5,009,865 A | 4/1991 | Boden et al. | |
| 5,012,301 A | 4/1991 | Xu et al. | |
| 5,027,166 A | 6/1991 | Ohtsuka et al. | |
| 5,032,877 A | 7/1991 | Bate | |
| 5,075,740 A | 12/1991 | Ohtsuka et al. | |
| 5,075,754 A | 12/1991 | Shirai et al. | |
| 5,081,510 A | 1/1992 | Ohtsuka et al. | |
| 5,089,862 A | 2/1992 | Warner, Jr. et al. | |
| 5,097,227 A | 3/1992 | Yuan et al. | |
| 5,112,774 A | 5/1992 | Ohtsuka et al. | |
| 5,148,240 A | 9/1992 | Ohtsuka et al. | |
| 5,158,909 A | 10/1992 | Ohtsuka et al. | |
| 5,177,749 A | 1/1993 | Shigihara et al. | |
| 5,221,638 A | 6/1993 | Ohtsuka et al. | |
| 5,252,842 A | 10/1993 | Buck et al. | |
| 5,309,004 A | 5/1994 | Grudkowski | |
| 5,320,977 A | 6/1994 | Tanski et al. | |
| 5,399,886 A | 3/1995 | Hasegawa | |
| 5,449,925 A | 9/1995 | Baliga et al. | |
| 5,456,945 A | 10/1995 | McMillan et al. | |
| 5,496,779 A * | 3/1996 | Lee et al. | 438/182 |
| 5,540,772 A | 7/1996 | McMillan et al. | |
| 5,541,426 A | 7/1996 | Abe et al. | |
| 5,550,089 A | 8/1996 | Dutta et al. | |
| 5,606,195 A | 2/1997 | Hooper et al. | |
| 5,635,412 A | 6/1997 | Baliga et al. | |
| 5,650,014 A | 7/1997 | Tauber | |
| 5,821,171 A | 10/1998 | Hong et al. | |
| 5,888,583 A | 3/1999 | McMillan et al. | |
| 5,895,260 A | 4/1999 | Bhatnagar et al. | |
| 5,937,318 A | 8/1999 | Warner, Jr. et al. | |
| 5,956,578 A | 9/1999 | Weitzel et al. | |
| 5,962,883 A | 10/1999 | Hong et al. | |
| 6,118,152 A | 9/2000 | Yamaguchi et al. | |
| 6,160,290 A | 12/2000 | Pendharkar et al. | |
| 6,317,360 B1 | 11/2001 | Kanamori | |
| 6,429,032 B1 | 8/2002 | Okuyama et al. | |
| 6,468,837 B1 | 10/2002 | Pendharkar et al. | |
| 6,483,135 B1 | 11/2002 | Mizuta et al. | |
| 6,528,848 B1 | 3/2003 | Hoshino et al. | |
| 6,535,091 B2 | 3/2003 | Bechtle et al. | |
| 6,559,513 B1 | 5/2003 | Miller et al. | |
| 6,586,813 B2 | 7/2003 | Nagahara | |
| 6,603,185 B1 | 8/2003 | Jimbo et al. | |
| 6,605,842 B2 | 8/2003 | Hoshino et al. | |
| 6,611,044 B2 | 8/2003 | Pruijmboom et al. | |
| 6,686,611 B2 | 2/2004 | Okuyama et al. | |
| 6,690,037 B1 | 2/2004 | Desko et al. | |
| 6,703,678 B2 | 3/2004 | Hirokawa et al. | |
| 6,717,192 B2 | 4/2004 | Miyoshi | |
| 6,740,535 B2 * | 5/2004 | Singh et al. | 438/18 |
| 6,777,278 B2 | 8/2004 | Smith | |
| 6,790,753 B2 | 9/2004 | Desko et al. | |
| 6,797,594 B2 | 9/2004 | Hoshino et al. | |
| 6,828,645 B2 | 12/2004 | Jimbo et al. | |
| 6,867,078 B1 | 3/2005 | Green et al. | |
| 6,894,578 B1 | 5/2005 | Kishimoto et al. | |
| 6,900,518 B2 | 5/2005 | Udrea et al. | |
| 6,927,102 B2 | 8/2005 | Udrea et al. | |
| 6,939,781 B2 | 9/2005 | Redd et al. | |
| 6,940,285 B2 | 9/2005 | Montrose et al. | |
| 6,949,797 B2 | 9/2005 | Krumbein et al. | |
| 2005/0127398 A1 | 6/2005 | Taniguchi et al. | |
| 2007/0132021 A1 | 6/2007 | Kunii et al. | |

FOREIGN PATENT DOCUMENTS

| | | |
|---|---|---|
| EP | 1 326 283 A3 | 1/2004 |
| WO | WO 2005.114747 A2 | 12/2005 |
| WO | WO 2005 114747 A3 | 12/2005 |

OTHER PUBLICATIONS

Written Opinion of the International Searching Authority, or the Declaration dated Jul. 31, 2007, PCT/US2007/022217.

Huili Xing, Y. Dora Chini, S. Heikman, S. Keller, U.K. Misra, High Breakdown Voltage AIGaN-GaN HEMTs Achieved by Multiple Field Plates, IEEE Electronic Device Letters, vol. 25, No. 4, Apr. 4, 2004.

Notification Concerning Transmittal of International Preliminary Report on Patentability (Chapter 1 of the Patent Cooperation Treaty), PCT/US2007/022217 dated May 22, 2009 and the Written Opinion of the International Searching Authority, 7 pages.

Cheng-Guan et al, "Production Ready Ultra High Breakdown 6 pHEMT Techmology" CS MANTECH Conf. Tech Digest Apr. 2005 pp. 27-30.

Haematsu et al. "Developmentof L-Band 28v Operation GaAs FET and Optimization for Mass Production" in CS MANTECHConf. Tech Digest Apr. 2005 pp. 39-42.

Cheng-Guan Yuan, Y.Y. Hiseh, T.J. Yeh, Chung-Hsu Chen, D.W. Tu, Yu_Chi Wang, Joe Lie, Saas Murad, Ramon Schook, Frans Boteko, and Mark Tomensen, Production Ready Ultra High Breakdown 6. pHEMT Technology, CS MANTECH Conference Technical Digest, Apr. 2005, pp. 27-30.

H. Haematsu, T. Igarashi, F. Yamaki, A. Nitta, K. Inoue, and H.Kawata, Development of L-band 28 V Operation GaAs FET and Optimization for Mass Production. CS MANTECH Conference Technical Digest, Apr. 2005, pp. 39-42.

\* cited by examiner

US 7,662,698 B2

TRANSISTOR HAVING FIELD PLATE

TECHNICAL FIELD

This invention relates generally to transistors and more particularly to methods for forming field plates for such transistors.

BACKGROUND

As is known in the art, field plates have been used in the high voltage semiconductor devices for several decades. Recently they have been applied to compound semiconductors such as GaAs, SiC, and GaN for high power microwave amplifiers, see for example, Cheng-Guan Yuan, Y. Y. Hiseh, T. J. Yeh, Chung-Hsu Chen, D. W. Tu, Yu-Chi Wang, Joe Lie, Saas Murad, Ramon Schook, Frans Bonteko, and Mark Tomesen, "Production Ready Ultra High Breakdown 6" pHEMT Technology," in CS MANTECH Conference Technical Digest, April 2005, pp. 27-30, and H. Haematsu, T. Igarashi, F. Yamaki, A. Nitta, K. Inoue, and H. Kawata, "Development of L-band 28 V Operation GaAs FET and Optimization for Mass Production," in CS MANTECH Conference Technical Digest, April 2005, pp. 39-42. These techniques; however, require significant alteration to the existing non-field-plate based FET processing, and are not compatible with the well established low parasitic capacitance Tee-gate FET structure.

SUMMARY

In accordance with the present invention, a method is provided for forming a transistor device having a field plate. The method includes forming structure having a source electrode, a drain electrode, and a Tee gate on a semiconductor body. The Tee-gate has a vertically extending post portion with a horizontal top portion. The horizontal top portion has distal ends extending laterally outwardly from the vertically extending post portion. A dielectric layer is formed on the structure. A photo-resist layer is formed on the dielectric layer. An opening is formed in the photo-resist layer over only one of the two distal ends of the horizontal top portion of gate. The opening is formed only over the one of the two distal ends disposed closer to the drain electrode than the source electrode. A metal is deposited over the photo-resist layer with portions of the metal being disposed on the photo-resist layer and with other portions of the metal passing through the opening onto the exposed portions of the dielectric layer and with said one of the two distal ends preventing such metal from being deposited onto portions of the dielectric layer disposed under such one of the two distal ends, such one of the two distal ends masking the underlying portion of the dielectric layer from the metal with an air-gap being formed between the post portion and an edge of the metal. The photo-resist layer is removed along with the portions of the metal that was deposited on the photo-resist layer while leaving portions of the metal from regions of the dielectric layer exposed by the opening to form the field gate.

In one embodiment, the metal is evaporated.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
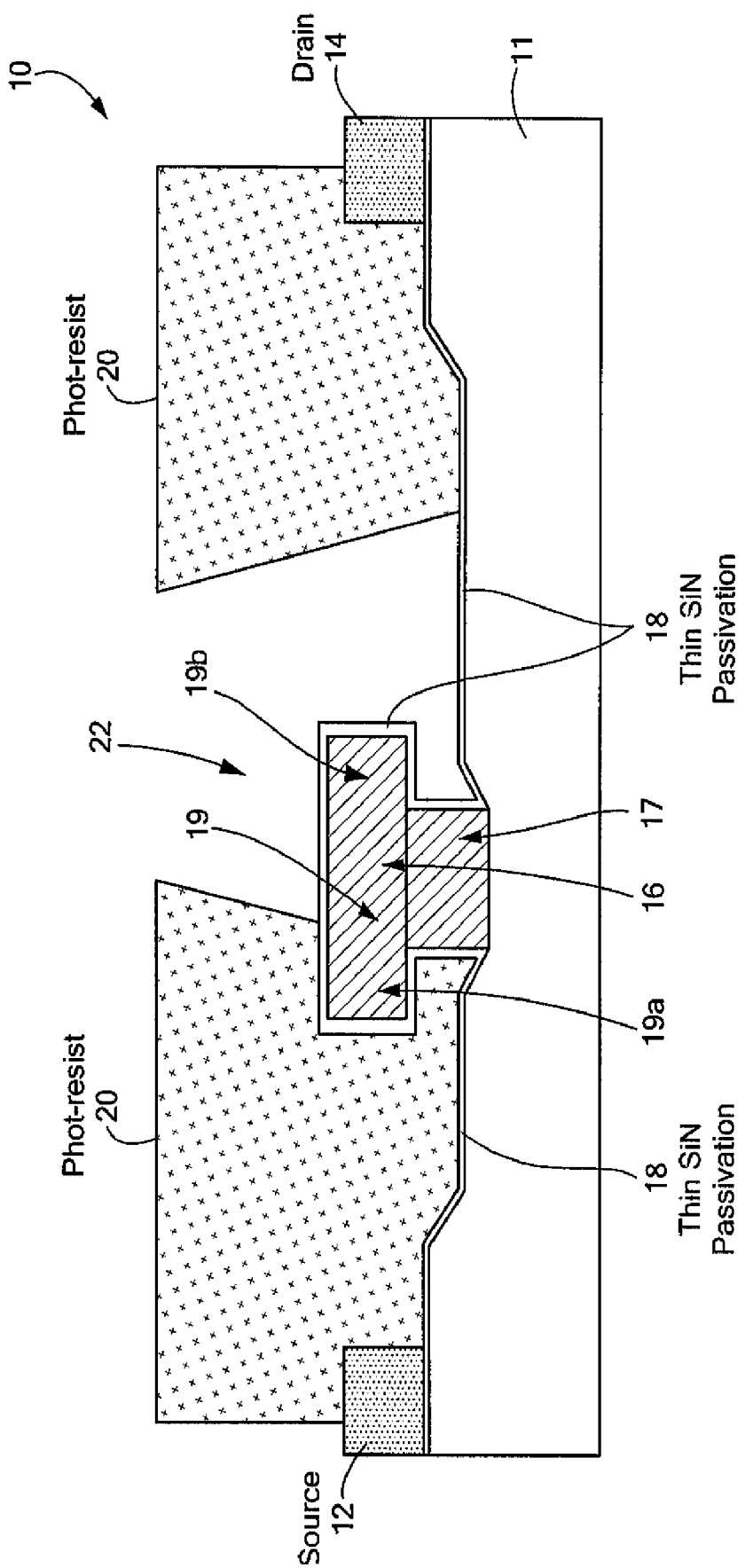
FIGS. 1, 2 and 3 are cross sectional diagrammatical sketches of a semiconductor device at various stages in the fabrication thereof in accordance with the invention.

Referring now to FIG. 1, a schematic cross section of a double recessed pHEMT semiconductor structure 10 is shown having a source electrode 12, a drain electrode 14 and a Tee gate 16 on a semiconductor body 11. Thus, the Tee-gate 16 has a vertically extending post portion 17 with a horizontal top portion 19, such horizontal top portion 19 having distal ends 19a, 19b that extend laterally outwardly from the vertically extending post portion 17.

Following the Tee-gate fabrication and passivation of the device with a thin, 500 Å of SiN dielectric layer 18, the wafer is coated with an industry standard photo-resist layer 20, such as 1808 from Shipley Company. The thickness of the SiN dielectric layer 18 may be in a range from 100 Å to 2000 Å. Next, this photo-resist layer 20 is patterned using image reversal technique to create an opening 22 of the order of 0.8-1.0 μm. It is noted that the opening 22 is formed over only one of the two distal ends 19a, 19b of the horizontal top portion 19 of gate 16, here the opening is formed only over distal end 19b. It is also noted that portion 19b is disposed closer to the drain electrode 14 than to the source electrode 12.

Figure 2:
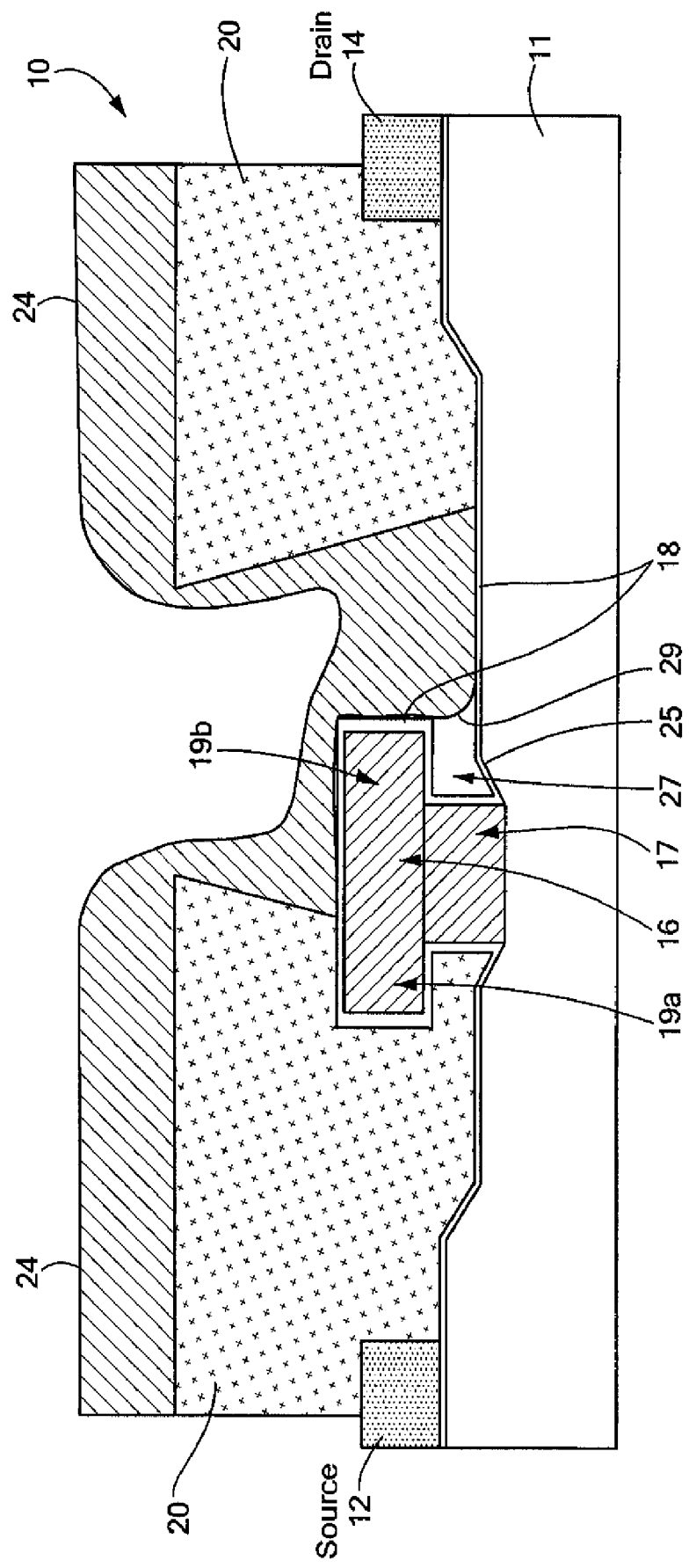

Next, referring to FIG. 2, Ti/Pt/Au metal 24 (1000 Å/1000 Å/3200 Å) is evaporated over the structure. Portions of the evaporated metal 14 are disposed on the photo-resist layer 20 while the other portions of the metal 20 pass through the opening 22 onto the exposed portions of the passivation layer 18. It is noted that the distal end 19b prevents the metal 24 from being deposited onto the portion 25 of the passivation layer 18 disposed under such distal end 19b. Thus, distal end 19b masks the underlying portion 25 of the passivation layer 18 from the metal of the metal 14 and an air-gap 27 is formed between the post portion 17 and an edge 29 of the metal 14.

Figure 3:
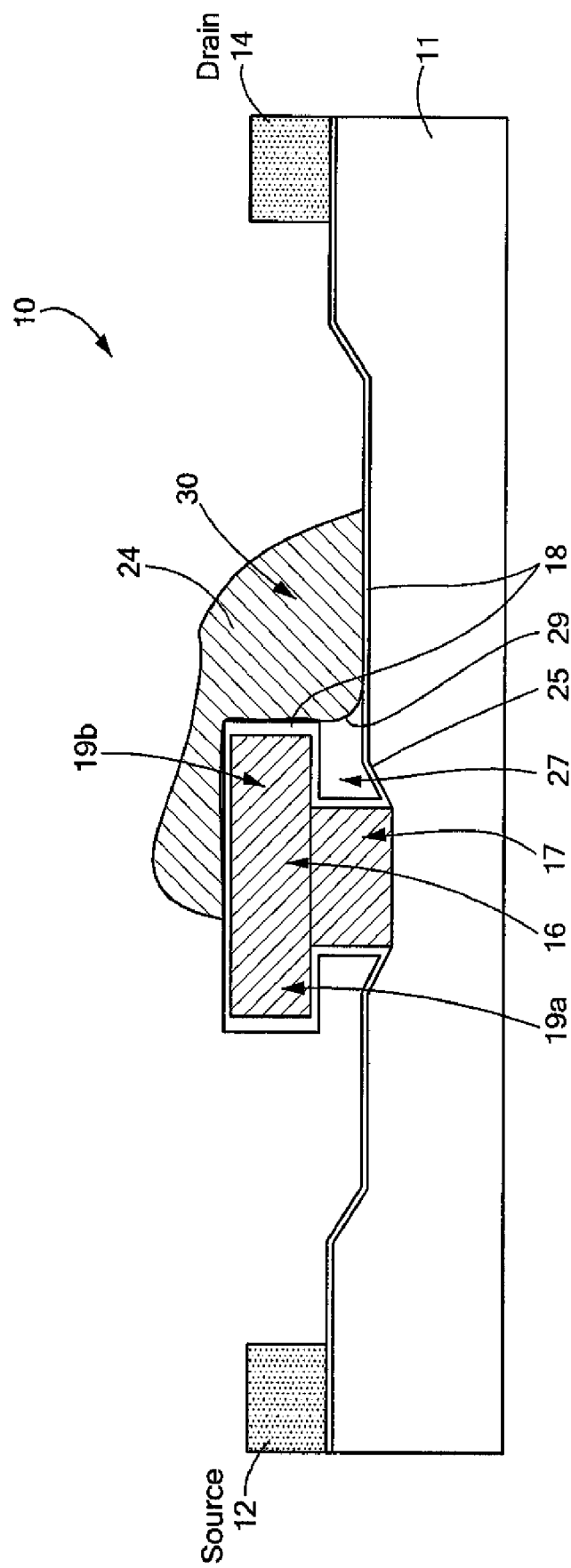

Referring now to FIG. 3, the photo-resist layer 20 (FIG. 2) is then lifted off thereby removing the portions of the metal 24 that was deposited on the photo-resist layer 20 but leaving portions 30 of the metal 24 from the regions of the passivation layer 18 exposed by the opening 22; it being again noted that the distal end 19b masked the underlying portion 25 of the passivation layer 18 from the metal of the metal 14. The resulting structure is shown in FIG. 3. The portions 30 of the metal 24 provide a self-aligned field plate for the transistor device 10.

Thus, the Tee-gate top (i.e., that the distal end 19b of the horizontal top portion 19 of gate 16) acts as a mask for the field plate metal 25. This results in a field plate dimension that is significantly smaller than the opening 22 of the field-plate mask. The separation between the edge 32 of the field plate 30 and the edge of the gate stem or post portion 17 is also determined by the Tee-top dimension (i.e., the length L shown in FIG. 3). In this way, the field plate 25 is self-aligned to the gate 16 and does not require any critical alignment step.

The dimension of the field plate 30 can be reduced much below 0.5 μm by moving the field plate mask opening (i.e., the opening 22) to the right side so that Tee-gate top acts a mask to block a larger part of the field plate.

A number of embodiments of the invention have been described. Nevertheless, it will be understood that various modifications may be made without departing from the spirit and scope of the invention. Accordingly, other embodiments are within the scope of the following claims.

What is claimed is:

1. A method for forming a transistor device having a field plate, comprising:

forming structure having a source electrode, a drain electrode, and a Tee gate on a semiconductor body, such Tee-gate having a vertically extending post portion with a horizontal top portion, such horizontal top portion having distal ends extending laterally outwardly from the vertically extending post portion;

forming a dielectric layer on the structure;

forming a photo-resist layer on the dielectric layer;

forming an opening in the photo-resist layer over only one of the two distal ends of the horizontal top portion of the gate, such opening being formed only over the one of the two distal ends disposed closer to the drain electrode than the source electrode;

depositing a metal over the photo-resist layer with portions of the metal being disposed on the photo-resist layer and with other portions of the metal passing through the opening onto portions of the dielectric layer exposed by the opening and with said one of the two distal ends preventing such metal from being deposited onto portions of the dielectric layer disposed under such one of the two distal ends, said one of the two distal ends masking the underlying portion of the dielectric layer from the metal with an air-gap being formed between the post portion and an edge of the metal; and lifting off the photo-resist layer removing the portions of the metal that was deposited on the photo-resist layer while leaving portions of the metal on regions of the dielectric layer exposed by the opening to form the field plate.

2. The method recited in claim 1 wherein the metal is evaporated.

3. A method for forming a transistor device having a field plate, comprising:

forming a structure having a source, a drain, and a Tee gate;

forming a photo-resist layer formed on the structure with an opening therein exposing only the one of the distal ends of the Tee gate;

depositing a metal over the photo-resist layer with portions of the metal being disposed on the photo-resist layer and with other portions of the metal passing through the opening onto portions of a dielectric layer exposed by the opening and with said one of the distal ends of the top of the Tee gate preventing such metal from being deposited onto portions of the dielectric layer disposed thereunder; and removing the photo-resist layer along with the portions of the metal deposited thereon while leaving portions of the metal ON regions of the dielectric layer exposed by the opening to form the field plate.

4. The method recited in claim 1 wherein the dielectric layer is SiN having a thickness of in the range from 100 Å to 2000 Å.

5. The method recited in claim 1 wherein the opening 22 is in the order of 0.8-1.0 μm.

6. The method recited in claim 1 wherein the metal is Ti/Pt/Au.

* * * * *

UNITED STATES PATENT AND TRADEMARK OFFICE
CERTIFICATE OF CORRECTION

| | | |
|---|---|---|
| PATENT NO. | : 7,662,698 B2 | Page 1 of 1 |
| APPLICATION NO. | : 11/557348 | |
| DATED | : February 16, 2010 | |
| INVENTOR(S) | : Tabatabaie | |

It is certified that error appears in the above-identified patent and that said Letters Patent is hereby corrected as shown below:

Abstract, line 4, delete "only the one" and replace with --exposing only the one--.

Abstract, line 9, delete "end" and replace with --ends--.

Column 1, lines 26-27, delete "techniques; however," and replace with --techniques, however--.

Column 1, line 28, delete "non-field-plate" and replace with --non-field plate--.

Column 2, line 28, delete "using image" and replace with --using an image--.

Column 2, line 60, delete "field-plate" and replace with --field plate--.

Column 3, line 1, delete "acts a" and replace with --acts as a--.

Column 4, line 24, delete "ON" and replace with --on--.

Signed and Sealed this

Twentieth Day of July, 2010

David J. Kappos
*Director of the United States Patent and Trademark Office*